United States Patent [19]

Suzuki et al.

[11] Patent Number: 4,879,686

[45] Date of Patent: Nov. 7, 1989

[54] SEMICONDUCTOR MEMORY DEVICE WITH A DATA CLEAR CIRCUIT

[75] Inventors: Azuma Suzuki, Yokohama; Takayuki Ootani, Tokyo; Mitsuo Isobe, Yokohama, all of Japan

[73] Assignee: Kabushiki Kaisha Toshiba, Kanagawa, Japan

[21] Appl. No.: 163,750

[22] Filed: Mar. 3, 1988

[30] Foreign Application Priority Data

Mar. 6, 1987 [JP] Japan .................................. 62-51354

[51] Int. Cl.⁴ ........................ G11C 7/00; G11C 11/40
[52] U.S. Cl. ........................... 365/189.11; 365/189.08; 365/218
[58] Field of Search ............... 365/218, 189, 190, 222, 365/203, 154, 155, 230

[56] References Cited

U.S. PATENT DOCUMENTS

| | | | |
|---|---|---|---|
| 4,272,834 | 6/1981 | Noguchi et al. | 365/230 |
| 4,393,473 | 7/1983 | Rufford | 365/190 |
| 4,481,610 | 11/1984 | Takemae et al. | 365/203 X |
| 4,516,224 | 5/1985 | Aoyama | 365/203 |
| 4,766,571 | 8/1988 | Kawashima | 365/189 |
| 4,780,847 | 10/1988 | Ito | 365/189 X |

Primary Examiner—Stuart N. Hecker
Assistant Examiner—Alyssa H. Bowler
Attorney, Agent, or Firm—Finnegan, Henderson, Farabow, Garrett and Dunner

[57] ABSTRACT

A semiconductor memory device comprising a memory cell-selecting section, an input supply control section, and a bit-line potential control section. The memory cell-selecting section includes a row decoder and a first gate circuit coupled to the output thereof. The memory cell-selecting section drives all the memory cells making up the memory device, when it is set in the mode for clearing the memory device, and the input data supply control section disconnects a pair of bit lines from a write circuit when the control section is set in this same mode. When the bit-line potential control section is set in the memory-clearing mode, it sets the potential of one of the bit lines at a high level, and the potential of the other bit line at a low potential.

12 Claims, 5 Drawing Sheets

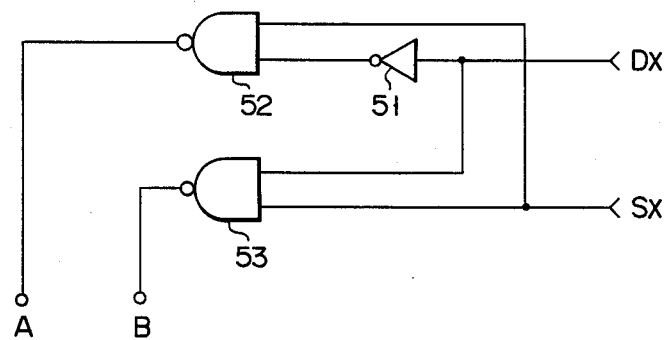
F I G. 3
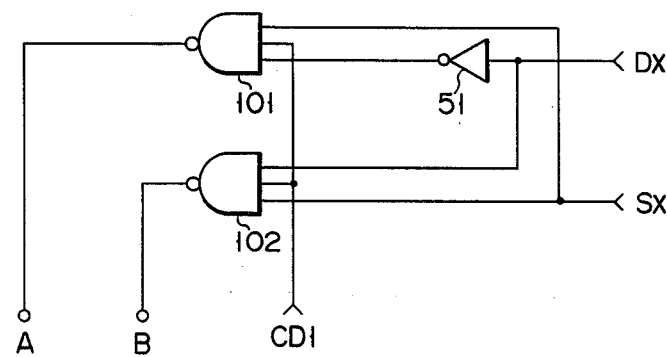
F I G. 7

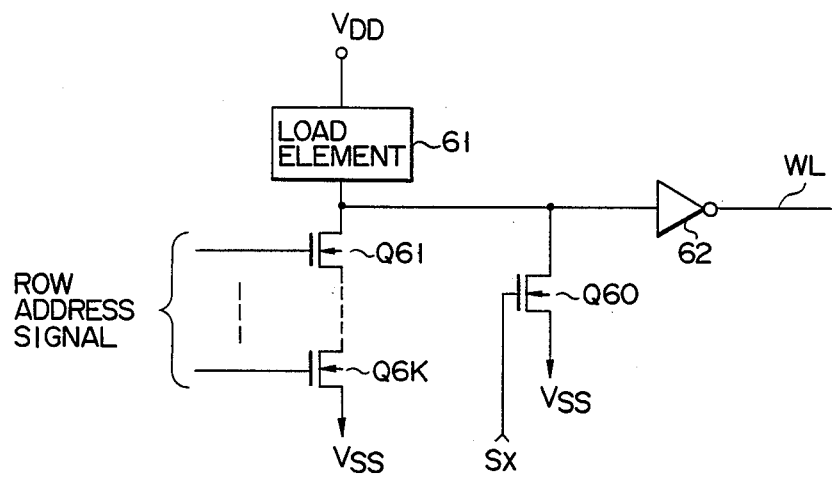
F I G. 4
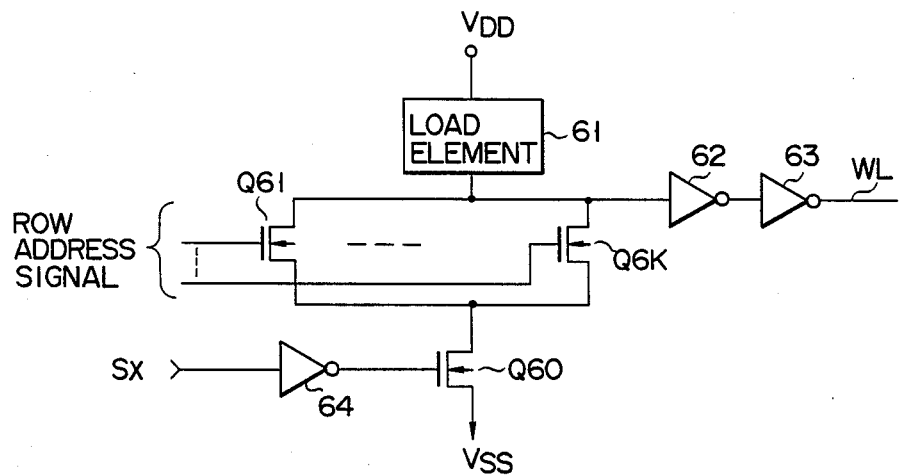
F I G. 5

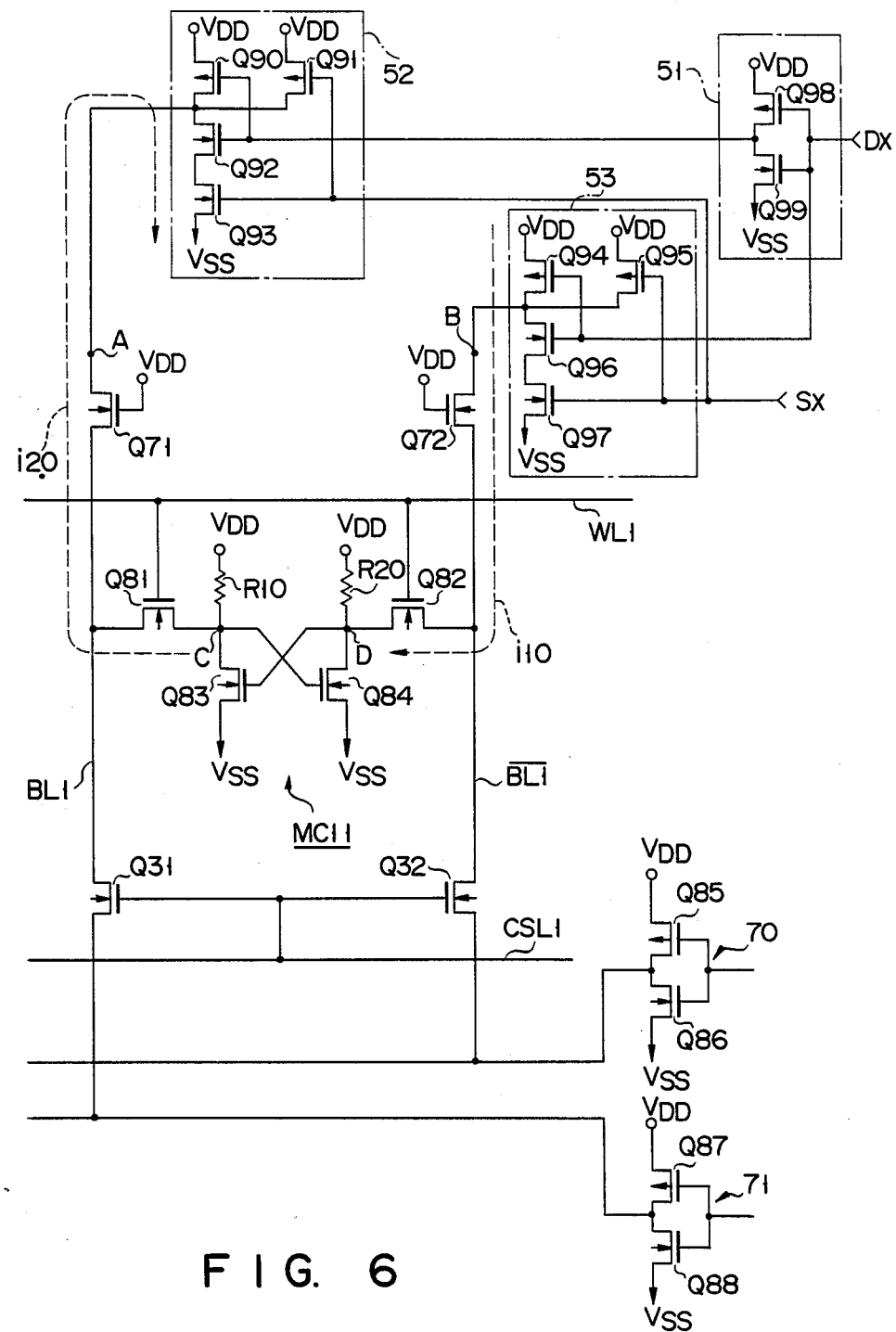
F I G. 6

SEMICONDUCTOR MEMORY DEVICE WITH A DATA CLEAR CIRCUIT

BACKGROUND OF THE INVENTION

1. Field of the Invention

The present invention relates to a semiconductor memory device, and more particularly, to a semiconductor memory device which can be cleared such that the data stored in all the memory cells are rewritten to the same values.

2. Description of the Related Art

Stated briefly, a semiconductor memory device is cleared by writing data "0" or "1" into each of its memory cells. The way in which a conventional SRAM is cleared will now be explained in detail, with reference to FIG. 1, which shows only a one-column section of a SRAM.

Assuming that data "1" is stored in a static memory cell MC, the potentials at nodes C and D of the flip-flop are then at a "1" level and a "0" level, respectively. How the data stored in memory cell MC is rewritten from "1" to "0" will now be described.

First, a row decoder (not shown) raises the potential on word line WL to the "1" level. As a result, N-type MOS FETs Q1 and Q2, whose gates are coupled to word line WL, are turned on. A column-selecting signal CD, which is an output of a column decoder (not shown) is raised to the "1" level. As a result, N-type MOS FETs Q3 and Q4, whose gates receive this signal CD, are also turned on. Inverters 1 and 2, which constitute a data-writing circuit, are driven by a write control circuit (not shown). Inverter 1 supplies a "1"-level signal to bit line te,ovs/BL/, whereas inverter 2 supplies a "0"-level signal to bit line BL. As a result, current i3 flows to node D of the flip-flop, thus raising the potential at node D from the "0" level to the "1" level. This is because current i3 is the sum of current i1 flowing to node D from power-supply potential terminal $V_{DD}$ through bit line te,ovs/BL/, and current i2 flowing to node D from terminal $V_{DD}$ through P-type MOS FET Q11 of inverter 1, N-type MOS FET Q4, and bit line te,ovs/BL/.

On the other hand, the potential at node C of the flip-flop is lowered from the "1" level to the "0" level, since current i4 flows from node C to ground potential terminal $V_{SS}$ through N-type MOS FETs Q1 and Q3 and N-type MOS FET Q22 of inverter 2.

When the potential at node D rises from the "0" level to the "1" level, and the potential at node C falls from the "1" level to the "0" level, N-type MOS FETs Q7 and Q8 of the flip-flop are turned on and off, respectively. Hence, while the data stored in memory cell MC is being rewritten from "1" to "0", currents I1 and, as is illustrated in FIG. 1, I2 continue flowing from power-supply potential terminal $V_{DD}$ to ground potential terminal $V_{SS}$. Since neither current I1 nor current I2 contributes to this data-writing process, it is obvious therefore, that a relatively large amount of power is wasted in the process of rewriting the data stored in memory cell MC.

To clear a semiconductor memory device, the data-writing operation described above must be performed in relation to all the memory cells incorporated in the memory device. Consequently, a very large amount of power is bound to be wasted every time the memory device is cleared.

SUMMARY OF THE INVENTION

It is accordingly the object of the present invention to provide a semiconductor memory device which can be cleared with the expenditure of a relatively small amount of power.

According to this invention, there is provided a semiconductor memory device comprising: a memory cell array having a plurality of memory cells; a bit line section having a pair of bit lines connected to several specified ones of the memory cells of the memory cell array; a mode-selecting section for selecting a first mode or a second mode; a memory cell-selecting section for driving one of the specified memory cells when set in the first mode, and for driving all specified memory cells when set in the second mode; an input data supply control section for supplying externally input data to the bit lines when set in the first mode, and for supplying no data to the bit lines when set in the second mode; and a bit-line potential control section for raising the potential of the bit lines to a high level when set in the first mode, and for raising the potential of the first bit line to the high level and lowering the potential of the second bit line to a low level when set in the second mode.

The data can be written into the specified memory cells, without the need for a data-writing circuit. As a result, the semiconductor memory device according to the invention can be cleared with the expenditure of a relatively small amount of power.

BRIEF DESCRIPTION OF THE DRAWINGS

FIG. 3 is a logic circuit diagram showing the data clear circuit used in the semiconductor memory device of FIG. 2;

FIG. 4 is a circuit diagram showing a one-row section of the row decoder used in the semiconductor memory device shown in FIG. 2;

FIG. 5 is a circuit diagram illustrating a one-row section of the first gate circuit used in the semiconductor memory device shown in FIG. 2;

FIG. 6 is a circuit diagram for explaining the operation of the semiconductor memory device illustrated in FIG. 2; and FIG. 7 is a logic circuit diagram showing a modification of the data clear circuit.

DETAILED DESCRIPTION OF THE PREFERRED EMBODIMENT

Figure 1:
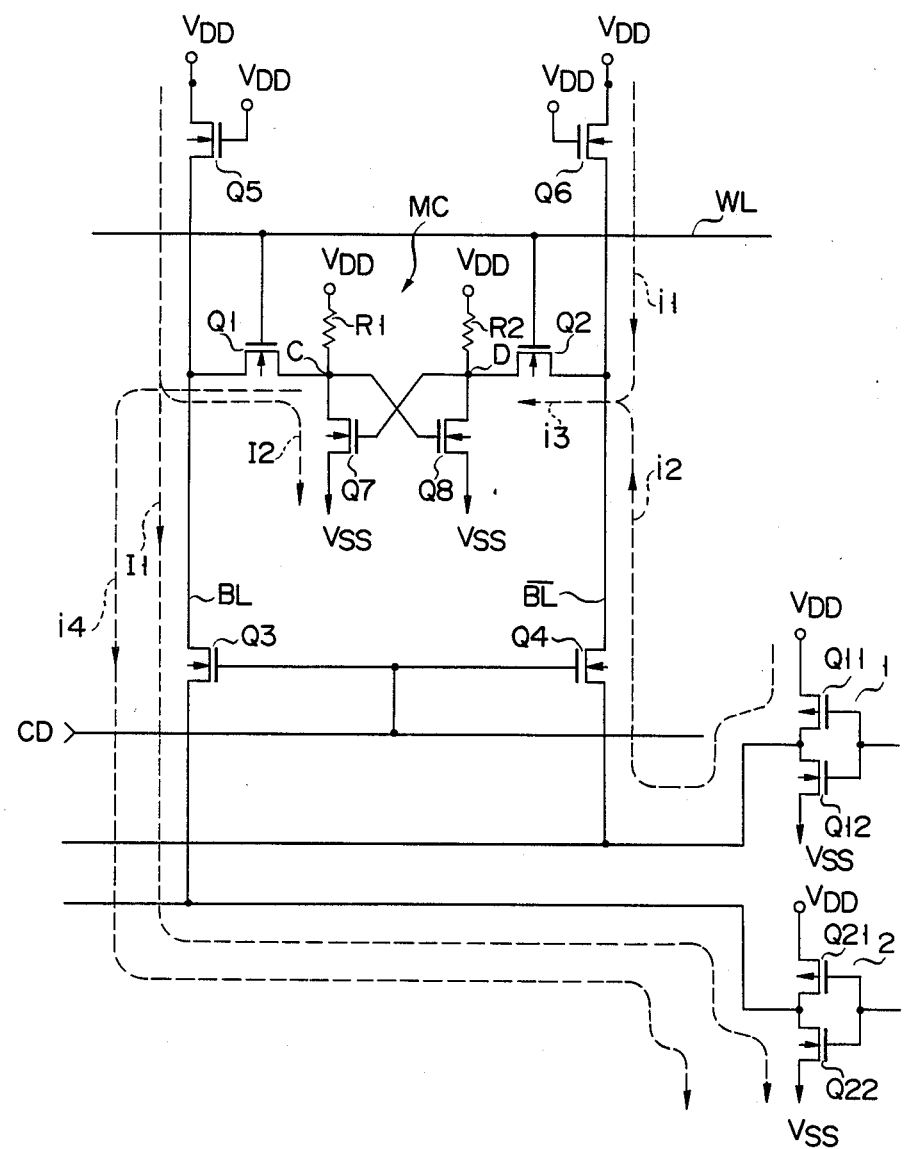
FIG. 1 is a circuit diagram showing a conventional semiconductor memory device.

A semiconductor memory device according to an embodiment of the invention will now be described, with reference to FIG. 2 which shows only two column units, CU1 and CU2, of the memory device.

Column unit CU1 comprises a pair of bit lines, BL1 and $\overline{BL1}$. Static memory cells MC11 to MCn1 and sense amplifier SAI are connected to bit lines BL1 and $\overline{BL1}$, as are also load circuit 11 and data clear circuit 12.

In addition, data clear circuit 12 is connected to input terminals T1 and T2, and is controlled by clear data Dx and memory-clear signal Sx, which are externally supplied to input terminals T1 and T2, respectively. When memory-clear signal Sx is at a "0" level, data clear circuit 12 sets the potential at node A of bit line BL1 at a "1" level, and the potential at node B of bit line $\overline{BL1}$ at the "1" level, also. When memory-clear signal Sx is at the "1" level, data clear circuit 12 sets nodes A and B at different levels, in accordance with the value of clear data Dx. More specifically, when clear data Dx is at the "1" level, data clear circuit 12 sets node A at the "1" level, and node B at the "0" level.

Column unit CU1 further comprises write circuit 13. Write circuit 13 is connected to bit line $\overline{BL1}$ by way of N-type MOS FET Q31, and to bit line BL1, by way of N-type MOS FET Q32. N-type MOS FET Q31 functions as a switch for selecting or not selecting bit line BL1. Similarly, N-type MOS FET Q32 functions as a switch for selecting or not selecting bit line $\overline{BL1}$. The gates of FETs Q31 and Q32 are coupled to column-selecting line CSL1.

Column unit CU2 is identical in structure to column unit CU1, and has a pair of bit lines, $\overline{BL2}$. Static memory cells MCl2 to MCn2 and sense amplifier SA2 are connected to bit lines BL2 an $\overline{BL2}$, as are also load circuit 21 and data clear circuit 22.

Data clear circuit 22 is additionally connected to input terminals T1 and T2, and performs the same function as data clear circuit 12 of column unit CU1. When memory-clear signal Sx is at the "0" level, data clear circuit 22 sets node A of bit line BL2 and node B of bit line $\overline{BL2}$ at the "1" level. When memory-clear signal Sx is at the "1" level, data clear circuit 22 sets node A and B at different levels, in accordance with the value of clear data Dx. More precisely, when clear data Dx is at the "1" level, data clear circuit 22 sets node A at the "1" level, and node B at the "0" level.

Column unit CU2 further comprises write circuit 23. Write is circuit 23 is connected to bit line BL2 by way of N-type MOS FET Q33, and to bit line $\overline{BL2}$, by way of N-type MOS FET Q34. N-type MOS FET Q33 functions as a switch for selecting or not selecting bit line BL2. Similarly, N-type MOS FET Q34 functions as a switch for selecting or not selecting bit line $\overline{BL2}$. The gates of FETs Q33 and Q34 are coupled to column-selecting line SCL2.

Memory cells MC11 and MC12 are coupled to word line WLI, thereby forming the first row; memory cells MC21 and MC22 are connected to word line WL2, thereby forming the second row; memory cell MC31 and MC32 are connected to word line WL3, thereby forming the third row; and so forth, and memory cells MCn1 and MCn2 are coupled to word line WLn, thereby forming the nth row.

Figure 2:
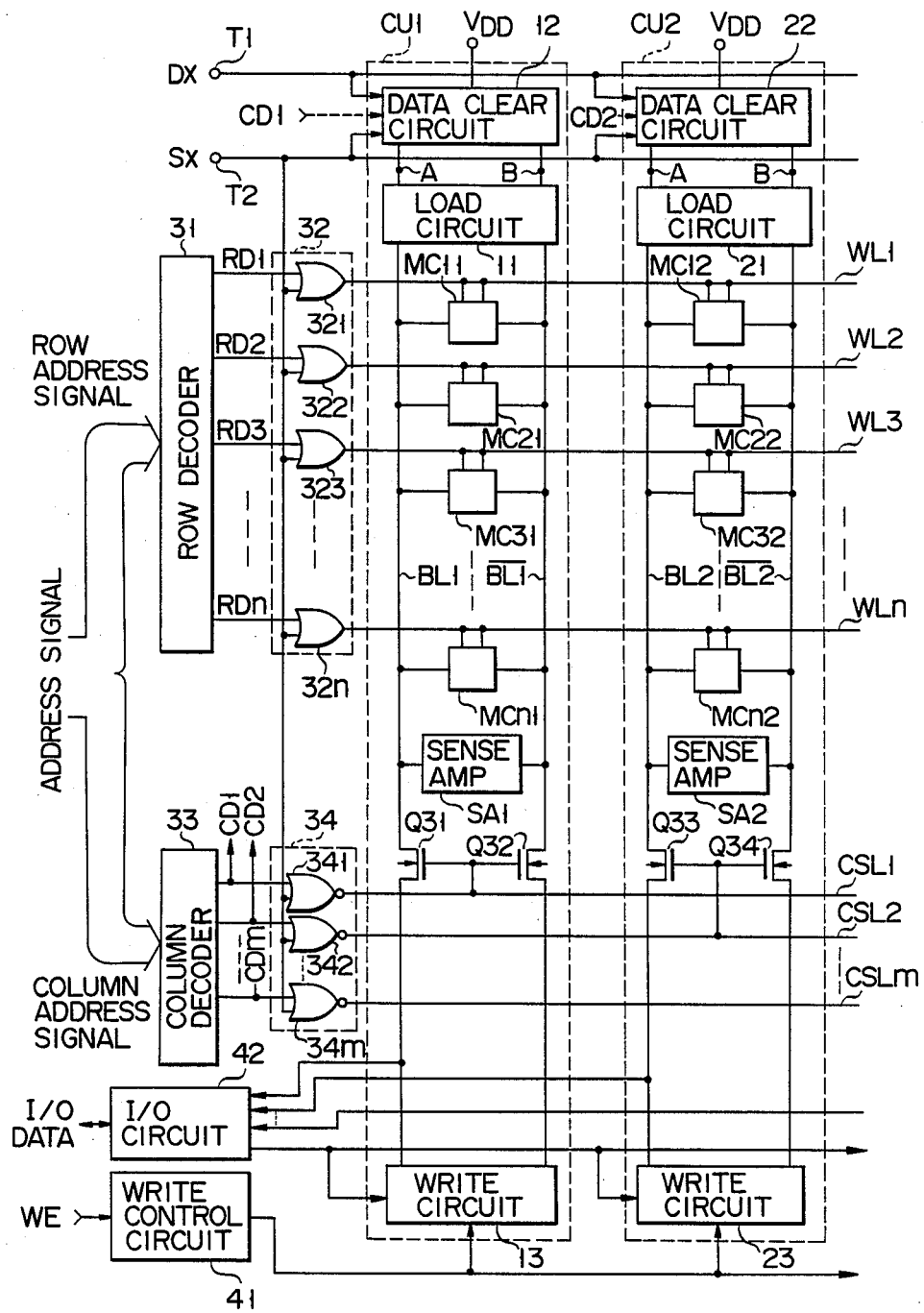
FIG. 2 is a block diagram illustrating a semiconductor memory device according to the present invention.

As is shown in FIG. 2, the semiconductor memory device further comprises row decoder 31 and column decoder 33, both connected to an external device.

Row decoder 31 decodes any row address signals supplied from the external device, and outputs signals RDI to RDn, one of which is at the "1" level. Output signals RD1 to RDn are supplied via first gate circuit 32 to word lines WLI to WLn, respectively. First gate circuit 32 comprises OR gates 32*l* to 32*n*. The two input terminals of each OR gate are connected to row decoder 31 and input terminal T2, respectively. Therefore, output signals RDI to RDn of row decoder 31 are supplied to the first inputs of OR hates 32*l* to 32*n*, whereas memory-clear signal Sx is supplied to the second inputs of these OR gates. The outputs of OR gates 32*l* to 32*n* are coupled to word lines WLI to WLn, respectively. When memory-clear signal Sx is at the "0" level, one of word lines WL1 to WLn is selected to have its potential raised to the "1" level, since one of signals RD1 to RDn is at the "1" level. On the other hand, when memory-clear signal Sx is at the "1" level, all word line WL1 to WLn are selected, whereby their potentials are set at the "1" level. Hence, when memory-clear signal Sx is at the "1" level, memory cells MC11 to MCn2 are all driven.

Column decoder 33 decodes any column address signal supplied from the external device, and outputs signals CD1 to CDm, one of which is at the "1" level. Output signals CD1 to CDm are supplied via second gate circuit 34 to column-selecting lines CSLI to CSLM, respectively. Second gate circuit 34 comprises NOR gates 34*l* to 34*m*. The two input terminals of each NOR gate are coupled to column decoder 33 and input terminal T2, respectively. Thus, output signals CDI to CDm of column decoder 33 are supplied to the first inputs of NOR gates 34*l* to 34*m*, whereas memory-clear signal Sx is supplied to the second inputs of these NOR gates. The outputs of NOR gates 34*l* to 34*m* are connected to column-selecting lines CSL1 to CSLm, respectively. When memory-clear signal Sx is at the "0" level, one of column-selecting lines CSL1 to CSLm is selected, and, since one of output signals CDI to CDm of column decoder 33 is at the "1" level, the potential of the selected line rises to the "1" level. Assuming that column-selecting line SCL1 is selected, MOS FETs Q31 and Q32, both coupled to line CSLI, are turned on. Thus, the first pair of bit lines, i.e., bit lines BL1 and $\overline{BL1}$, or the first column of memory cells is selected. On the other hand, when memory-clear signal Sx is at the "1" level, none of column-selecting lines CSL1 to CSLm are selected, which results in all the MOS FETs coupled to any column-selecting line being turned off. No pairs of bit lines, in other words, no columns of memory cells are selected.

Write circuits 13 and 23 are both controlled by write control circuit 41. Write control circuit 41 is connected to receive write enable signal WE. When write enable signal WE is at the "1" level, circuit 41 causes write circuit 13 to supply bit lines BL1 and $\overline{BL2}$ with the input data which has been input to write circuit 13 via I/O circuit 42, and causes write circuit 23 to supply bit lines BL2 and $\overline{BL2}$ with the input data which has been input to write circuit 23 via I/O input circuit 42.

Data clear circuits 12 and 22 have the structure shown in FIG. 3. More precisely, as is shown in FIG. 3, each data clear circuit comprises one inverter 51, and two-input NAND gates, 52 and 53. Clear data Dx is supplied to an input of inverter 51. An output signal of inverter 51 is supplied to the first input of NAND gate 52, and memory-clear signal Sx is supplied to the second input of NAND gate 52. The output of NAND gate 52 is coupled to node A. Memory-clear signal Sx is supplied to the first input of NAND gate 53, and clear data Dx is supplied to the second input of NAND gate 53. The output of NAND gate 53 is coupled to node B.

FIG. 4 shows a one-row section of row decoder 31, and that one-row section of first gate circuit 32 which is associated therewith. As is illustrated in FIG. 4, load element 61 and k MOS FETs Q6*l* to Q6*k* are connected in series, between power-supply potential terminal, $V_{DD}$ and ground potential terminal $V_{SS}$. The number of MOS FETs, i.e., k, equals the number of bits which form a row address signal, these bits being supplied are to each of the gates of MOS FETs Q6*l* to Q6*k*. The connecting point between load element 61 and MOS FET Q61 is connected to the input of inverter 62, the output of which is coupled to word line WL. N-type MOS FET Q60 is connected between the input of inverter 62 and ground potential terminal $V_{SS}$. Memory-clear signal Sx is supplied to the gate of this MOS FET Q60. It should be noted that each one-row section of row decoder 31 differs from any other one-row section, as regards the choice of conductivity type for each of MOS FETs Q6l to Q6k.

When MOS FETs Q6l to Q6k are turned on by the row address signal, the potential of word line WL is set at the "1" level by the output signal of inverter 62. When memory-clear signal Sx is at the "1" level, N-type MOS FET Q60 is turned on, thus lowering to the "0" level the potential at the input of inverter 62. When this occurs, the potential of word line WL is set at the "1" level, regardless of the value of the row address signal.

FIG. 5 illustrates a modification of the circuit shown in FIG. 4, i.e., the combination of a one-row section row decoder 31 and a one-row section of first gate circuit 32. As is shown in FIG. 5, MOS FETs Q6l to Q6k are connected in parallel. Each of the parallel-connected MOS FETs is coupled at one end to power-supply potential terminal $V_{DD}$ by means of load element 61, and at the other end to ground potential terminal $V_{SS}$, by means of N-type MOS FET Q60. Memory-clear signal Sx is supplied to the gate of MOS FET Q60 via inverter 64. When signal Sx is at the "1" level, FET Q60 remains off, and the potential at the first end of each of parallel-connected MOS FETs Q6l to Q6k is at the "1" level, regardless of the value of the row address signal input to row decoder 31. As a result, inverters 62 and 63 set the potential of word line wL at the "1" level.

FIG. 6 shows in detail a part of the semiconductor memory device according to this invention. N-type MOS FETs Q71 and Q72 shown in this figure correspond to load circuit 21 of FIG. 2. The gates of these FETs are connected to power-supply potential terminal $V_{DD}$. As is shown in FIG. 6, static memory cell MCll is composed of a flip-flop section and a data-transferring section. The flip-flop section consists of N-type MOS FETs Q83 and Q84, and the data-transferring section consists of N-type MOS FETs Q81 and Q82. Inverters 70 and 71 constitute the write buffer section of write section 13 (FIG. 2). Inverter 70 is a CMOS inverter composed of P-type MOS FET Q85 and N-type MOS FET Q86. Inverter 71 is also a CMOS inverter, and is composed of P-type MOS FET Q87 and N-type MOS FET Q88.

As is shown in FIG. 6, data clear circuit 12 (FIG. 2) comprises inverter 51, and NAND gates 52 and 53. Inverter 51 itself consists of P-type MOS FET Q98 and N-type MOS FET Q99, NAND gate 52 is composed of P-type MOS FETs Q90 and Q91, and N-type MOS FETs Q92 and Q93, while NAND gate 53 is composed of P-type MOS FETs Q94 and Q95, and N-type MOS FETs Q96 and Q97.

With reference to FIG. 6, it will now be explained how the semiconductor memory device is cleared. This memory device is cleared when memory-clear signal Sx externally supplied to the device is at the "1" level. As has been described, the potential of every word line is set at the "1" level, irrespective of the value of the row address signal input to row decoder 31, and the potential of every column-selecting lines is set at the "0" level. Thus, word line WLI and column-selecting line CSLI are set at the "1" level and the "0" level, respectively. Since column-selecting line CSLI is at the "0" level, MOS FETs Q31 and Q32, both coupled to line CSLI, are off.

Assuming that memory cell MCII stores data "1", it will be explained how to write data "0" into this memory cell by the memory-clearing operation. While memory cell MCII is storing data "1", the potential of node C of the flip-flop section is at the "1" level, whereas the potential of node D of the flip-flop section is at the "0" level. When memory-clear signal at the "1" level and clear data Dx at the "0" level are supplied to data clear circuit 12 under this condition, data clear circuit 12 sets the potentials at nodes A and B at the "0" level and the "1" level, respectively. As a result, current i10 flows from power-supply potential terminal $V_{DD}$ to node D via FETs Q94, Q72, and Q82, as is indicated by the broken line. At the same time, current i20 flows from node C to ground potential terminal $V_{SS}$ via FETs Q81, Q71, Q92, and Q93, as is indicated by another broken line.

These currents i10 and i20 raise the potential at node D from the "0" level to the "1" level, and lower the potential at node C from the "1" level to the "0" level. Therefore, FET Q83 is turned on, whereas FET Q84 is turned off. Since the potential at node A is at the "0" level, and FET Q31 is off, no current flows from node A to write circuit 13 via FET Q31, unlike in the conventional memory device illustrated in FIG. 1.

Hence, the data stored in memory cell MCll is rewritten from "1" to "0". Any other memory cell storing data "1" is cleared, and its storage data is rewritten to "0", in the same way. The memory cells storing data "0" keep storing this data, in spite of the fact that the memory device has been cleared. Therefore, the data stored in every memory cell of this semiconductor memory device can be rewritten to data "0", without using a data-writing circuit.

When memory-clear signal Sx at the "1" level and clear data at the "1" level are supplied to data clear circuit 12, the data stored in every memory cell of the memory device is rewritten to data "1".

When memory-clear signal externally supplied to the semiconductor memory device is at the "0" level, data clear circuit 12 sets the potentials of nodes A and B at the "1" level. In this case, therefore, data can be written by write circuit 13 into the memory cells in the ordinary manner.

FIG. 7 shows a circuit which can be used as either data clear circuit 12 or data clear circuit 22. This circuit is different from the circuit of FIG. 3, in that three-input NAND gates 101 and 102 are used in place of two-input NAND gates 52 and 53. Column-selecting signal CDl is supplied from column decoder 33 to the third input terminal of either three-input NAND gate. When data clear circuits 12 and 22 are each made of this circuit, the semiconductor memory device can be cleared, column by column.

The input data externally supplied to I/O circuit 42 can be used as clear data Dx. If this is the case, terminal T1 for receiving clear data Dx can be dispensed with.

As has been described in detail, the data items stored in all memory cells of the semiconductor memory device according to this invention can be simultaneously rewritten to the same value, thereby clearing the memory device. Hence, the power required for clearing the memory device is relatively small.

What is claimed is:

1. A semiconductor memory device comprising:
   a memory cell array having a plurality of memory cells;
   bit line means having a pair of first and second bit lines connected to a number of specified memory cells of said memory cell array;

mode-selecting means for selecting one of a first mode and a second mode;

memory cell-selecting means for driving one of the specified memory cells when set in the first mode, and for driving all specified memory cells when set in the second mode;

input data supply control means for supplying externally input data to the bit lines when set in the first mode, and for supplying no data to the bit lines when set in the second mode; and bit-line potential control means connected to said first and second bit lines for raising the potential of the first and second bits lines to a high level when set in the first mode, and for raising the potential of the first bit line to the high level and lowering the potential of the second bit line to a low level when set in the second mode.

2. The semiconductor memory device according to claim 1, wherein said mode-selecting means includes an input terminal for receiving an externally supplied memory-clear signal, and for selecting the first mode when the input terminal receives no memory clear-signals and for selecting the second mode when the input terminal receives the memory-clear signal.

3. The semiconductor memory device according to claim 2, wherein said bit-line potential control means is controlled by externally supplied clear data and said memory-clear signal.

4. The semiconductor memory device according to claim 3, wherein said bit-line potential control means includes a data-clear circuit comprising a first two-input NAND gate, an inverter whose input is connected to receive said first NAND gate receiving said memory-clear signal at the first input, receiving said clear data at the second input, and having an output coupled to one of said bit lines, and said second NAND gate receiving said memory-clear signal at the first input, receiving an output signal of said inverter, and having an output coupled to the other bit line.

5. The semiconductor memory device according to claim 2, wherein said memory cell-selecting means includes a load element connected at one end to a power-supply potential terminal, a plurality of MOS FETs connected in serial fashion between the other end of said load element and a ground potential terminal, each MOS FET having a gate, the number of said MOS FETs being equal to the number of bits forming a row address signal, so as to receive, at respective gates at said MOS FETs, the respective bits of the row address signal, an inverter coupled at its input to the other end of said load element and at its output to said specified memory cells, and an N-type MOS FET connected between the other end of said load element and said ground potential terminal, and receiving said memory-cell signal at its gate.

6. The semiconductor memory device according to claim 2, wherein said memory cell-selecting means includes a load element connected at one end to a power-supply potential terminal, an N-type MOS FET connected at one end to a ground potential terminal, said MOS FET having a gate, a first inverter having an input connected to receive said memory-clear signal and an output coupled to the gate of said N-type MOS FET, a plurality of MOS FETs having gates and connected in parallel between the other end of said N-type MOS FET and the other end of said load element, the number of said MOS FETs being equal to the number of bits forming a row address signal, so as to receive, at respective gates of said plurality of MOS FETs, the respective bits of the row address signal, and second and third inverters connected in cascade fashion between the other end of said load element and one of said specified memory cells.

7. The semiconductor memory device according to claim 1, wherein said memory cell-selecting means includes a row decoder for decoding an externally supplied row address signal, and a first gate circuit for driving one of said specified memory cells, in accordance with an output signal of said row decoder when set in the first mode, and for driving all specified memory cells when set in the second mode.

8. The semiconductor memory device according to claim 1, wherein said input data supply control means includes a write circuit for supplying the externally input data to the bit lines, a switch circuit connected between the write circuit and said bit lines, a column decoder for decoding an externally supplied column address signal, thereby generating a column-selecting signal, and a second gate circuit for controlling said switch circuit, in accordance with the column-selecting signal when set in the first mode, and for turning off said switch circuit when set in the second mode.

9. The semiconductor memory device according to claim 8, wherein said bit-line potential control means is controlled by externally supplied clear data and said memory-clear signal, and wherein said clear data is externally input to said write circuit.

10. The semiconductor memory device according to claim 8, wherein said bit line potential control means is controlled by externally supplied clear data and said memory-clear signal, wherein said bit-line potential control means is controlled by a column-selecting signal output by said column decoder, and raising the potential of said first bit line to the high level and lowering the potential of the second bit line to the low level, in response to the column-selecting signal when in the second mode.

11. The semiconductor memory device according to claim 10, wherein said bit-line potential control means includes a data clear circuit comprising a first three-input NAND gate, an inverter whose input is connected to receive said clear data, and a second three-input NAND gate, said first NAND gate receiving said memory-clear signal at the first input, receiving said clear data at the second input, receiving said column-selecting signal at the third input, and having an output coupled to one of said bit lines, and said second NAND gate receiving said memory-clear signal at the first input, receiving an output signal of the inverter at the second input, receiving said column-selecting signal at the third input, and having an output coupled to the second bit line.

12. The semiconductor memory device according to claim 10, wherein said clear data is externally input to said write circuit.

* * * * *

UNITED STATES PATENT AND TRADEMARK OFFICE
CERTIFICATE OF CORRECTION

PATENT NO. : 4,879,686

DATED : November 07, 1989

INVENTOR(S) : Azuma Suzuki et al.

It is certified that error appears in the above-identified patent and that said Letters Patent is hereby corrected as shown below:

Claim 2, Column 7, Lines 22-23, change "clear-signals" to --clear-signal--.

Claim 4, Column 7, Line 33, "receive" should be followed by --said clear data, and a second two input NAND gate,--.

Signed and Sealed this

Twenty-fourth Day of December, 1991

Attest:

HARRY F. MANBECK, JR.

*Attesting Officer*     *Commissioner of Patents and Trademarks*